(12) United States Patent
McGarvey et al.

(10) Patent No.: US 10,276,610 B2
(45) Date of Patent: Apr. 30, 2019

(54) SEMICONDUCTOR PHOTOMULTIPLIER

(71) Applicant: SensL Technologies Ltd, County Cork (IE)

(72) Inventors: Brian McGarvey, Templemartin (IE);
Stephen John Bellis, Rushbrooke (IE);
John Carlton Jackson, Cobh (IE)

(73) Assignee: SensL Technologies Ltd., County Cork (IE)

( * ) Notice: Subject to any disclaimer, the term of this patent is extended or adjusted under 35 U.S.C. 154(b) by 230 days.

(21) Appl. No.: 15/582,158

(22) Filed: Apr. 28, 2017

(65) Prior Publication Data
US 2017/0236852 A1 Aug. 17, 2017

Related U.S. Application Data

(63) Continuation of application No. 14/801,592, filed on Jul. 16, 2015, now Pat. No. 9,659,980, which is a
(Continued)

(51) Int. Cl.
*H01L 27/14* (2006.01)
*H01L 27/144* (2006.01)
(Continued)

(52) U.S. Cl.
CPC ......... *H01L 27/1446* (2013.01); *H01L 24/16* (2013.01); *H01L 24/48* (2013.01); *H01L 24/49* (2013.01); *H01L 24/73* (2013.01); *H01L 25/162* (2013.01); *H01L 25/167* (2013.01); *H01L 27/1443* (2013.01); *H01L 31/024* (2013.01); *H01L 31/02005* (2013.01); *H01L 31/02019* (2013.01); *H01L 31/02027* (2013.01); *H01L 31/107* (2013.01); *H01L 23/481* (2013.01); *H01L 24/13* (2013.01); *H01L 24/94* (2013.01); *H01L 2224/131* (2013.01); *H01L 2224/16145* (2013.01); *H01L 2224/48145* (2013.01); *H01L 2224/48227* (2013.01); *H01L 2224/48247* (2013.01); *H01L 2224/4912* (2013.01); *H01L 2224/73257* (2013.01);
(Continued)

(58) Field of Classification Search
CPC ......... H01L 24/16; H01L 24/48; H01L 24/49; H01L 24/73; H01L 27/1447; H01L 27/1443
See application file for complete search history.

(56) References Cited

U.S. PATENT DOCUMENTS

2013/0099100 A1  4/2013  Pavlov
2014/0183684 A1  7/2014  Sadygov et al.
(Continued)

FOREIGN PATENT DOCUMENTS

WO    2011117309 A2    9/2011

*Primary Examiner* — Matthew L Reames
(74) *Attorney, Agent, or Firm* — Polansky & Associates, P.L.L.C.

(57) ABSTRACT

The present disclosure relates to a semiconductor photomultiplier comprising a substrate; an array of photosensitive cells formed on the substrate that are operably coupled between an anode and a cathode. A set of primary bus lines are provided each being associated with a corresponding set of photosensitive cells. A secondary bus line is coupled to the set of primary bus lines. An electrical conductor is provided having a plurality of connection sites coupled to respective connection locations on the secondary bus line for providing conduction paths which have lower impedance than the secondary bus line.

34 Claims, 18 Drawing Sheets

Related U.S. Application Data continuation-in-part of application No. 14/577,123, filed on Dec. 19, 2014, now abandoned.

(51) Int. Cl.
| | | |
|---|---|---|
| *H01L 31/02* | (2006.01) | |
| *H01L 31/107* | (2006.01) | |
| *H01L 31/024* | (2014.01) | |
| *H01L 25/16* | (2006.01) | |
| *H01L 23/00* | (2006.01) | |
| *H01L 23/48* | (2006.01) | |

(52) U.S. Cl.
CPC *H01L 2224/94* (2013.01); *H01L 2924/00014* (2013.01); *H01L 2924/1205* (2013.01); *H01L 2924/1207* (2013.01); *H01L 2924/12043* (2013.01); *H01L 2924/1304* (2013.01)

(56) References Cited

U.S. PATENT DOCUMENTS

| | | |
|---|---|---|
| 2015/0041627 A1 | 2/2015 | Webster |
| 2016/0079464 A1 | 3/2016 | Sasaki et al. |

SEMICONDUCTOR PHOTOMULTIPLIER

RELATED APPLICATIONS

This application is a continuation of U.S. application Ser. No. 14/801,592, filed Jul. 16, 2015, now U.S. Pat. No. 9,659,980, issued May 23, 2017, which claims priority from and is a continuation-in-part of U.S. patent application Ser. No. 14/577,123, filed Dec. 19, 2014, now abandoned, which applications are incorporated herein in their entirety. Related subject matter is found in a co-pending patent application entitled "Semiconductor Photomultiplier", U.S. patent application Ser. No. 15/335,658, filed Oct. 27, 2016, invented by Brian McGarvey, Stephen John Bellis and John Carlton Jackson and assigned to the assignee hereof

FIELD OF THE INVENTION

The present disclosure relates to photon detectors. In particular, the present disclosure relates to high sensitivity photon detectors such as semiconductor photomultipliers. In particular, but not exclusively, the present disclosure relates to semiconductor photomultipliers (SiPMs or SPMs) in such areas as Positron Emission Tomography [PET], including Time-Of-Flight PET [TOF-PET], Laser Ranging [LIDAR] applications, bio luminescence, High Energy Physics [HEP] detectors.

BACKGROUND

SiPMs are semiconductor photon sensitive devices made up of an array of very small Geiger-mode avalanche photodiode (APD) cells on a substrate such as silicon. APD cells vary in dimension from several micron to 100 microns depending on the mask used, and can have a typical density of up to 3000 microcells/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength, but has high multiplication noise. InGaAs (Indium Gallium Arsenide) detects to a maximum wavelength of 1.6 µm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 µm, requires cooling to reduce dark currents, and can achieve a very low level of excess noise.

Silicon avalanche diodes can function with breakdown voltages of 100 to >1000V, typically. APDs exhibit internal current gain effect of about 100-1000 due to impact ionization, or avalanche effect, when a high reverse bias voltage is applied (approximately 100->200 V in silicon, depending on the doping profile in the junction). Silicon Photomultipliers or SiPMs can achieve a gain of $10^5$ to $10^6$ by using Geiger mode APDs also known as Single Photon Avalanche Diodes (SPADs) which operate with a reverse voltage that is greater than the breakdown voltage, and by maintaining the dark count event rate at a sufficiently low level. The current generated by an avalanche event must be quenched by an appropriate current limited scheme so that the device can recover and reset after an avalanche event. SiPM sensors have lower operating voltages than APDs and have a breakdown voltage from 10-100 Volts.

Silicon Photomultipliers typically include a matrix of major and minor bus lines. The minor bus lines connect directly to the microcells. The minor bus lines are then joined to bond pads by a major bus line. The minor bus lines are loaded with the inductance, capacitance and resistance of the microcells. The major bus lines are then loaded with the inductance, capacitance and resistance of the minor bus lines. The rise time, delay and recovery time of signal from a microcell on the SiPM will therefore depend strongly on its position in the SiPM. The variation in rise time and delay across the array will give rise to increased jitter and therefore increased coincidence resolving time (CRT) or timing jitter.

There is therefore a need to provide a semiconductor photomultiplier which addresses at least some of the drawbacks of the prior art.

SUMMARY

In one aspect, there is provided a semiconductor photomultiplier comprising:
a substrate;
an array of photosensitive elements formed on a first major surface of the substrate;
a plurality of primary bus lines interconnecting the photosensitive elements;
at least one segmented secondary bus line provided on a second major surface of the substrate which is operably coupled to one or more terminals; and
multiple vertical interconnect access (vias) extending through the substrate operably coulping the primary bus lines to the at least one segmented secondary bus line.

In another aspect, the photosensitive element comprises a single photon avalanche diode (SPAD).

In a further aspect, a quench element is associated with each SPAD. Advantageously, the quench element is a passive component resistor. Preferably, the quench element is an active component transistor.

In one aspect, each segment of the segmented secondary bus line has an associated via coupled to a corresponding primary bus line.

In a further aspect, each photosensitive element is part of a microcell.

In another aspect, at least some of the segments of the segmented secondary bus line are of equal length in order to equalise the signal delays from the microcells to the one or more terminals.

In a further aspect, the length of at least some of the primary bus lines are of equal length in order to equalise the signal delays from the microcells to the one or more terminals.

In one aspect, each microcell comprises a photodiode. Advantageously, each microcell comprises a resistor coupled in series to the photodiode. Preferably, a capacitive element is provided.

In another aspect, the interconnected photosensitive elements are arranged in a grid configuration.

In a further aspect, the primary buses lines are parallel to columns in the grid configuration. Advantageously, at least some of the primary bus lines extend between the columns.

In another aspect, the primary and secondary bus lines are perpendicular to each other. Advantageously, each photosensitive element comprises an avalanche photodiode or a single photon avalanche diode.

In one aspect, each interconnected photosensitive element comprises a quench resistor coupled in series to the avalanche photodiode or a single photon avalanche diode.

The present disclosure relates to a substrate comprising:
an array of photosensitive elements formed on a first major surface of the substrate;
a plurality of primary bus lines interconnecting the photosensitive elements;
at least one segmented secondary bus line provided on a second major surface of the substrate which is operably coupled to one or more terminals; and
multiple vertical interconnect access (vias) extending through the substrate operably coulping the primary bus lines to the at least one segmented secondary bus line.

The present disclosure also relates to a method of fabricating a semiconductor photomultiplier; the method comprising:
forming an array of photosensitive elements on a first major surface of a substrate;
providing a plurality of primary bus lines interconnecting the photosensitive elements;
providing at least one segmented secondary bus line on a second major surface of the substrate which is operably coupled to one or more terminals; and
providing multiple vertical interconnect access (vias) extending through the substrate operably coulping the primary bus lines to the at least one segmented secondary bus line.

The present disclosure also relates to a semiconductor photomultiplier comprising:
a substrate;
an array of photosensitive cells formed on the substrate that are operably coupled between an anode and a cathode;
a set of primary bus lines each being associated with a corresponding set of photosensitive cells;
a secondary bus line coupled to the set of primary bus lines;
an electrical conductor having a plurality of connection sites coupled to respective connection locations on the secondary bus line for providing conduction paths which have lower impedance than the secondary bus line.

In one aspect, the array of photosensitive cells are formed on a first major surface of the substrate.

In another aspect, the secondary bus line is provided on the first major surface of the substrate. In one aspect, the electrical conductor is provided on a second major surface of the substrate which is opposite the first major surface.

In one aspect, interconnects extend between the connection sites and the connection locations. Advantageously, each connection site has an associated connection location which are wire bonded together. In one example, the respective connection sites are uniformly spaced apart. In another exemplary arrangement, the respective connection locations are uniformly spaced apart.

In a further aspect, the electrical conductor is provided as an output lead on a leadframe. Advantageously, the leadframe includes a cathode lead and an anode lead. In one exemplary arrangement, the output lead includes a plurality of fingers each defining a corresponding connection site. In one example, each finger is associated with a corresponding one of the connection locations on the secondary bus line. Advantageously, each connection location on the secondary bus line has an associated landing pad for receiving a wire bond.

In one aspect, the electrical conductor comprises a metal track. Advantageously, the electrical conductor is provided on a carrier substrate. In exemplary arrangements, the carrier substrate comprises one of a leadframe, a PCB, a ceramic chip carrier, and a pre-molded chip carrier.

In a further aspect, the array of photosensitive cells are arranged in a grid configuration. Advantageously, at least some of the primary bus lines extend between the columns of the grid configuration. In one example, the primary bus lines are parallel to one another.

In one aspect, the photosensitive cell comprises a single photon avalanche diode (SPAD). Advantageously, a quench element is associated with each SPAD. In one example, the quench element is a passive component resistor. In another example, the quench element is an active circuit of component transistors.

In an exemplary arrangement each photosensitive cell comprises a photodiode. Advantageously, each photosensitive cell comprises a resistor coupled in series to the photodiode. In one example, each photosensitive cell comprises a capacitive element.

In another exemplary arrangement, each photosensitive cell comprises an avalanche photodiode or a single photon avalanche diode.

In one aspect, a heat sink is provided. In an exemplary arrangement, the heat sink is co-operable with the substrate. In one example, the heat sink is co-operable with the electrical conductor.

In one aspect, the substrate is provided on a first wafer. In one exemplary arrangement, the first wafer is operably coupled to a second wafer. Advantageously, the first wafer and the second wafer are in stacked arrangement. In one example, the first and second wafers are parallel to one another. In one arrangement, circuit components are provided on the second wafer. In one aspect, the first and second wafers are operably coupled together with a solder bump interconnection arrangement.

In another aspect, the connection sites of the electrical conductor are coupled to connection locations on the secondary bus without using through-silicon vias in order to maximise the area on the substrate available for accommodating photosensitive active areas.

The present disclosure also relates to a semiconductor photomultiplier comprising:
a substrate;
an array of photosensitive cells formed on the substrate that are operably coupled between an anode and a cathode;
a first set of primary bus lines and a second set of primary bus lines each being associated with a corresponding set of photosensitive cells;
a first secondary bus line coupled to the first set of primary bus lines;
a second secondary bus line coupled to the second set of primary bus lines;
a first electrical conductor having a plurality of connection sites coupled to respective connection locations on the first secondary bus line for providing conduction paths which have lower impedance than the first secondary bus line; and
a second electrical conductor having a plurality of connection sites coupled to respective connection locations on the second secondary bus line for providing conduction paths which have lower impedance than the second secondary bus line.

In one aspect, the first set of primary bus lines are capacitively coupled to the photosensitive cells. In another exemplary arrangement, the second set of primary bus lines are capacitively coupled to the photosensitive cells.

Additionally, the present disclosure relates to a semiconductor photomultiplier and readout system comprising:
an array of photosensitive cells operably coupled between an anode and a cathode;

a set of primary bus lines each being associated with a corresponding set of photosensitive cells;

a secondary bus line coupled to the set of primary bus lines;

an electrical conductor having a plurality of connection sites coupled to respective connection locations on the secondary bus line for providing conduction paths which have lower impedance than the secondary bus line; and a readout circuit operable for communicating with the electrical conductor.

Furthermore, the present disclosure relates to a semiconductor photomultiplier and a readout system comprising:

an array of photosensitive cells that are operably coupled between an anode and a cathode;

a first set of primary bus lines and a second set of primary bus lines each being associated with a corresponding set of photosensitive cells;

a first secondary bus line coupled to the first set of primary bus lines;

a second secondary bus line coupled to the second set of primary bus lines;

a first electrical conductor having a plurality of connection sites coupled to respective connection locations on the first secondary bus line for providing conduction paths which have lower impedance than the first secondary bus line;

a second electrical conductor having a plurality of connection sites coupled to respective connection locations on the second secondary bus line for providing conduction paths which have lower impedance than the second secondary bus line; and a readout circuit operable for communicating with the first and second electrical conductors.

The present disclosure also relates to a method of fabricating a semiconductor photomultiplier; the method comprising:

providing an array of photosensitive cells on a substrate that are operably coupled between an anode and a cathode;

providing a set of primary bus lines each being associated with a corresponding set of photosensitive cells;

providing a secondary bus line coupled to the set of primary bus lines; and providing an electrical conductor having a plurality of connection sites coupled to respective connection locations on the secondary bus line for providing conduction paths which have lower impedance than the secondary bus line.

Additionally, the present teaching is directed to a method of fabricating a semiconductor photomultiplier comprising:

providing an array of photosensitive cells on a substrate that are operably coupled between an anode and a cathode;

providing a first set of primary bus lines and a second set of primary bus lines each being associated with a corresponding set of photosensitive cells;

providing a first secondary bus line coupled to the first set of primary bus lines;

providing a second secondary bus line coupled to the second set of primary bus lines;

providing a first electrical conductor having a plurality of connection sites coupled to respective connection locations on the first secondary bus line for providing conduction paths which have lower impedance than the first secondary bus line; and providing a second electrical conductor having a plurality of connection sites coupled to respective connection locations on the second secondary bus line for providing conduction paths which have lower impedance than the second secondary bus line.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

Figure 1:
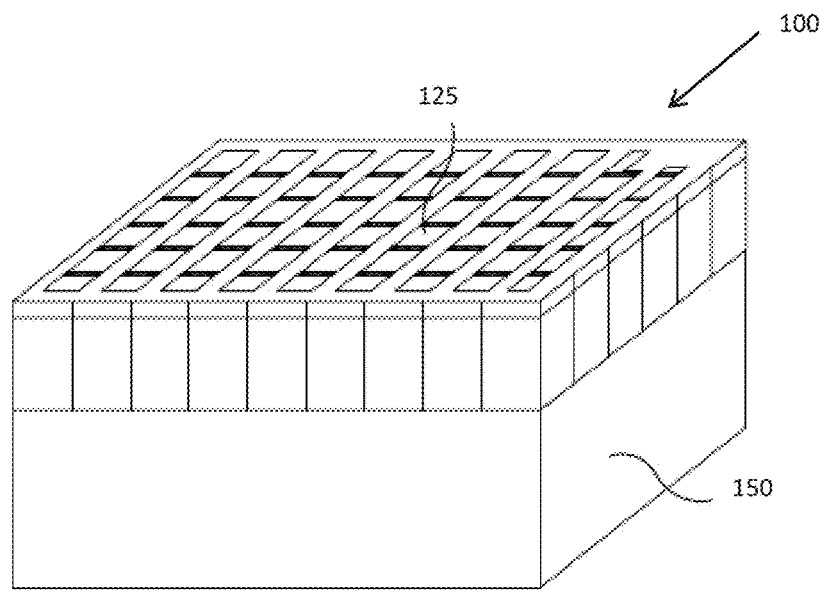
FIG. 1 illustrates an exemplary structure of a silicon photomultiplier.

The present disclosure will now be described with reference to some exemplary semiconductor photomultipliers. It will be understood that the exemplary semiconductor photomultipliers are provided to assist in an understanding of the teaching and is not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

Referring initially to FIG. 1, a silicon photomultiplier 100 comprising an array of Geiger mode photodiodes is shown. The array is formed on a semiconductor substrate 150 using semiconductor processes which will be known to one skilled in the art and may include for example, but not limited to, deposition, implantation, diffusion, patterning, doping, and etching. Patterned layers of conducting material, insulating material and doped areas of semiconductor form the structure of the photodiode. A quench resistor is provided adjacent to each photodiode which may be used to limit the avalanche current. The photodiodes are electrically connected to common biasing and ground electrodes by aluminium or similar conductive tracking.

Figure 2:
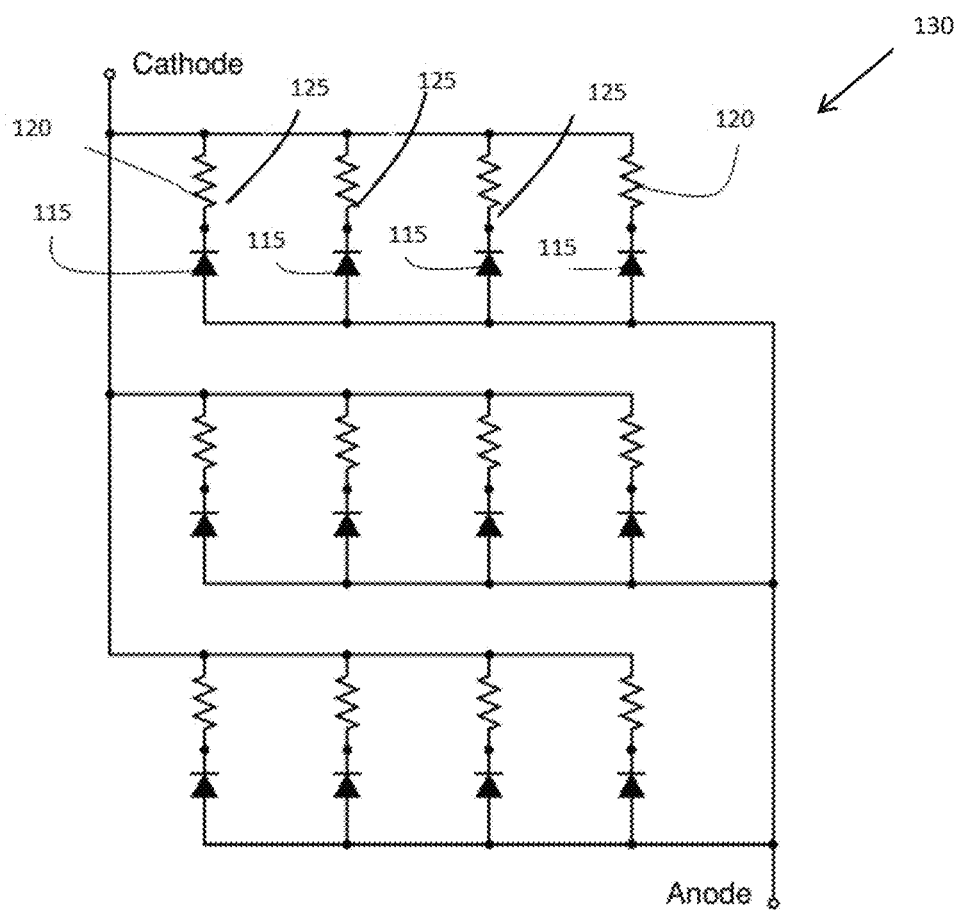
FIG. 2 is a schematic circuit diagram of an exemplary silicon photomultiplier.

The Silicon Photomultiplier 100 integrates a dense array of small, electrically and optically isolated Geigermode photodiodes 115. Each photodiode 115 is coupled in series to a quench resistor 120. Each photodiode 115 and its associated quench resistor 120 are referred to as a microcell 125. The number of microcells 125 typically number between 100 and 3000 per mm$^2$. The signals of all microcells 125 are then summed to form the output of the SiPM 100. A simplified electrical circuit 130 is provided to illustrate the concept in FIG. 2. Each microcell 125 detects photons identically and independently. The sum of the discharge currents from each of these individual binary detectors combines to form a quasi-analog output, and is thus capable of giving information on the magnitude of an incident photon flux.

Each microcell 125 generates a highly uniform and quantized amount of charge every time the microcell 125 undergoes a Geiger breakdown. The gain of a microcell 125 (and hence the detector) is defined as the ratio of the output charge to the charge on an electron. The output charge can be calculated from the over-voltage and the microcell capacitance.

$$G = \frac{C \cdot \Delta V}{q}$$

Where:
G is the gain of the microcell;
C is the capacitance of the microcell;
$\Delta V$ is the over-voltage; and
q is the charge of an electron.

Figure 3:
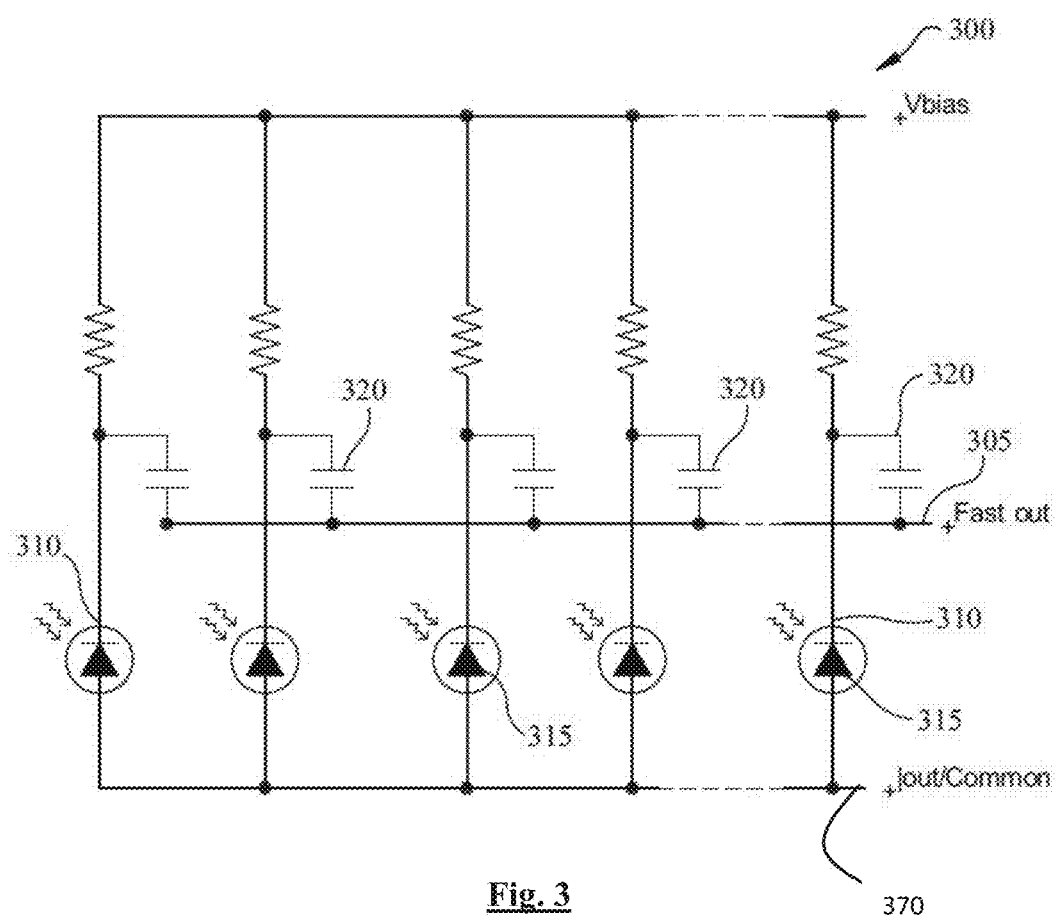
FIG. 3 is a schematic circuit diagram of an exemplary silicon photomultiplier.

Referring now to FIG. 3 which illustrates a silicon photomultiplier 300 described in PCT Patent Application no. WO 2011/117309 of which the present assignee is the applicant, the contents are incorporated herein by reference. The SPM 300 has a third electrode 305 which is capacitively coupled to each photodiode cathode 310 in order to provide a fast readout of the avalanche signals from the photodiodes 315. When the photodiode 315 emits a current pulse, part of the resulting change in voltage at the cathode 310 will be coupled via mutual capacitance 320 into the third (fast) electrode 305. Using the third electrode 305 for readout avoids the compromised transient performance resulting from the relatively large RC time constant associated with the biasing circuit.

Figure 4:
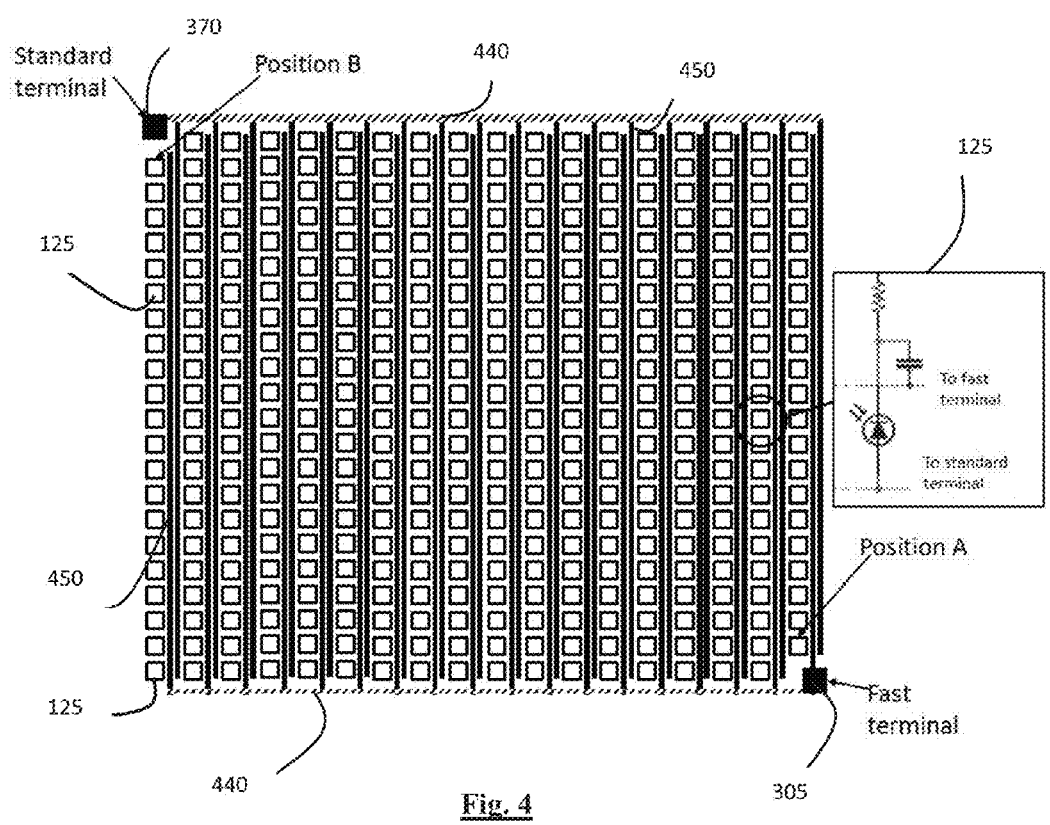
FIG. 4 is a top plan view of an exemplary silicon photomultiplier.

It will be appreciated by those skilled in the art that silicon photomultipliers comprise major (secondary) bus lines 440 and minor (primary) bus lines 450 as illustrated in FIG. 4. In silicon photomultipliers know heretofore the minor bus lines 450 connect directly to the microcells 125. The minor bus lines 450 are then coupled to major bus line 440 which connect to the bond pads associated with the terminals 370 and 305. Typically, the minor bus lines 450 extend vertically between the columns of microcells 125; while the major bus lines 440 extend horizontally adjacent the outer row of the microcells 125. The minor bus lines 450 are loaded with the inductance, capacitance and resistance of the microcells 125. The major bus lines 440 are then loaded with the inductance, capacitance and resistance of the minor bus lines 450. The rise time, delay and recovery time of signal from a microcell 125 on the SiPM will therefore depend significantly on its position in the SiPM. The variation in rise time and delay across the array will give rise to increased jitter and therefore increased coincidence resolving time (CRT). It will be appreciated by those skilled in the art that a microcell 125 firing at position A will have a very different signal path to microcell 125 firing at position B. The rise time and delay of the signal will be different as the signal path is not uniform. The range of these parameters impacts coincidence resolving time (CRT) significantly.

Figure 5:
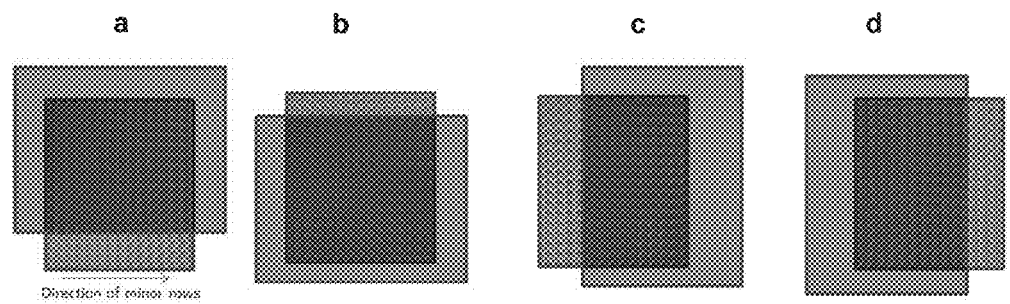
FIG. 5 is a diagrammatic view of four microcells.
Figure 6A:
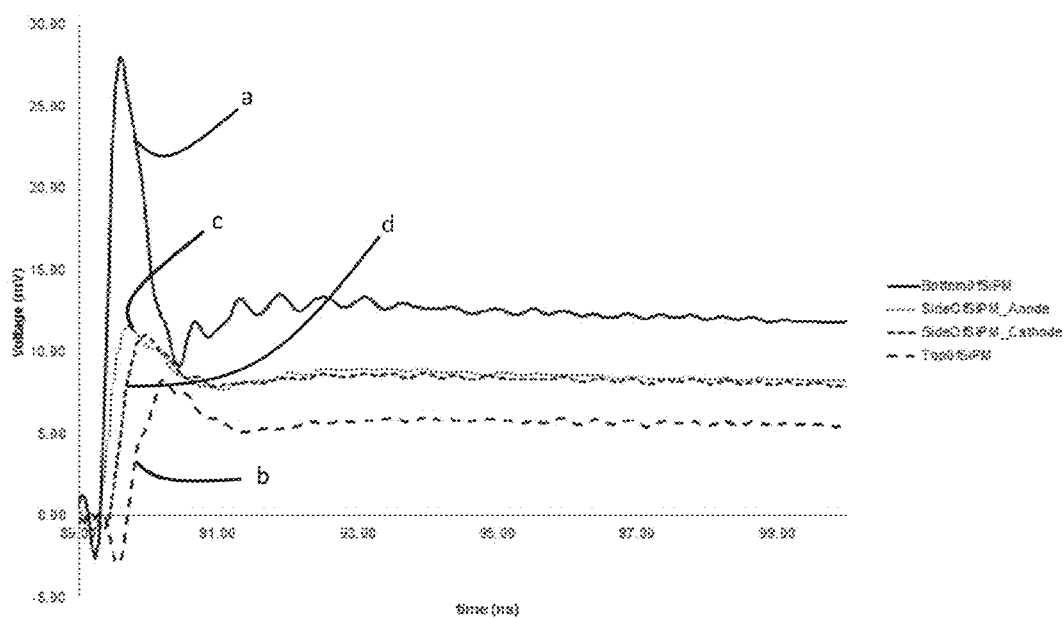
FIG. 6A is a graph showing that signal delay, rise time and overall shape depend on the position of the microcell.
Figure 6B:
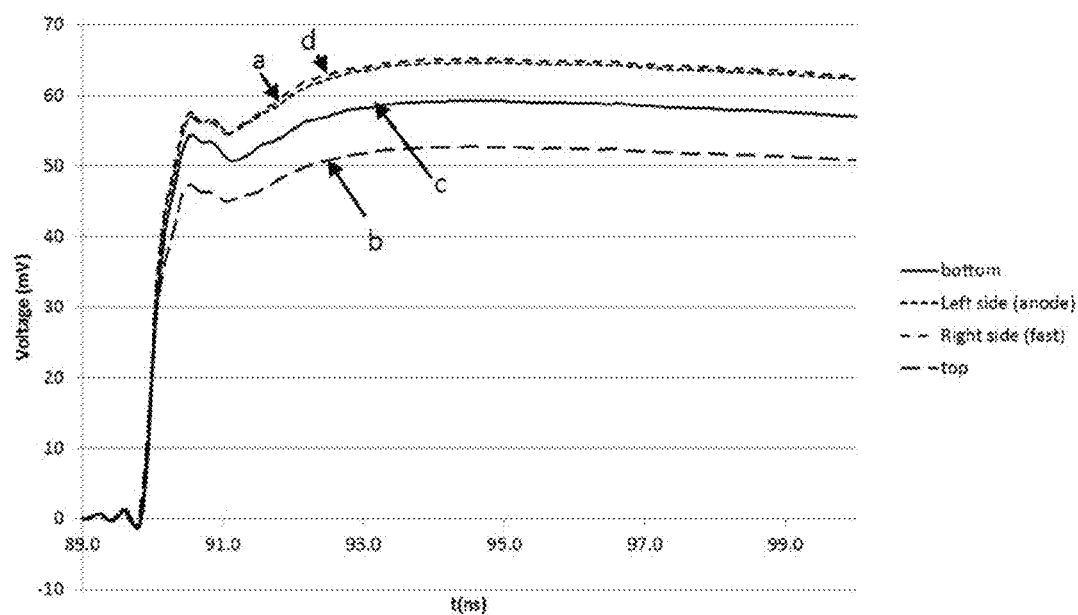
FIG. 6B is a graph showing the improvement in relation to signal delay and signal uniformity as result of using a segmented secondary (major) bus line in accordance with the present disclosure.
Figure 7:
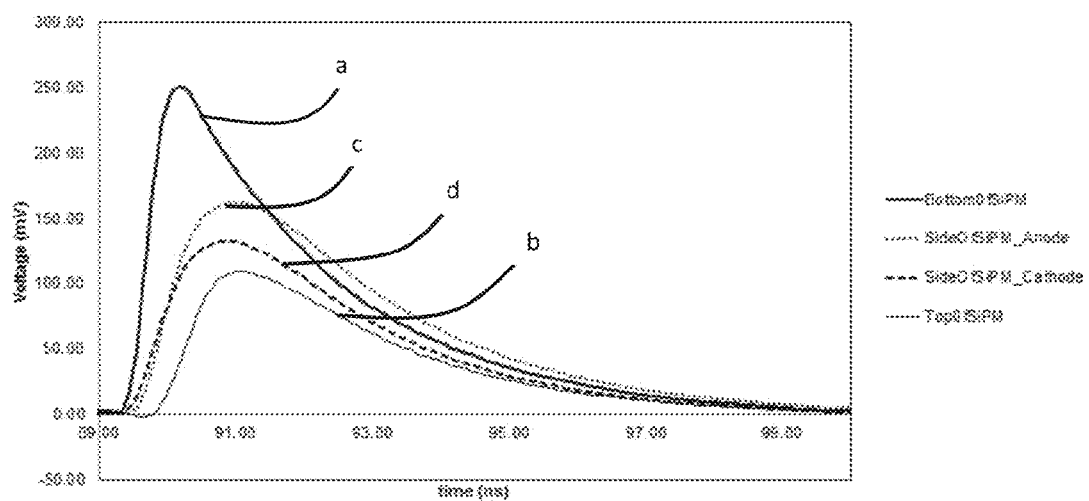
FIG. 7 is a graph showing that signal delay, rise time and overall shape depend on the position of the microcell.

Referring now to FIGS. 5 to 7, which shows experimental data to quantify the range of delays and rise times seen across a SiPM. Pulses coming from different areas of the SiPM were compared by partially (85%) blacking out areas as indicated by labels a, b, c, and d in FIG. 5.

a) The minor rows closest to the anode were exposed. The signal path along the major row is short.
b) The minor rows at the end of the major rows were exposed. This is the opposite of (a). The signal path along the major row will be long.
c) The microcells on the minor bus closest to the major bus are exposed. The signal path along the minor rows will be short.
d) The micro cells on the minor bus furthest from the major row are exposed. The signal path along the minor rows will be long.

It is clear from the graphs in FIGS. 6A, 6B and 7 that the standard terminal 370 and fast output terminal 305 signal delay, rise time and overall shape depend strongly on position on the major row. FIG. 6A illustrates the signals measured at the standard terminal 370, while FIG. 7 illustrates the signals measured at the fast terminal 305. The delay from difference between 'a' and 'b' is approximately 400 ps. FIG. 6B is a graph showing the improvement in relation to signal delay and signal uniformity as result of using a segmented secondary bus line in accordance with the present teaching. In the exemplary arrangement the delay $\Delta t$ was reduced to approximately 25 ps at 25 mV. An additional advantage of the segmented secondary bus approach results in greater uniformity in signal height which will further improve CRT and enable a wider range of threshold voltage selection to be used during an analogue to digital conversion.

Figure 8:
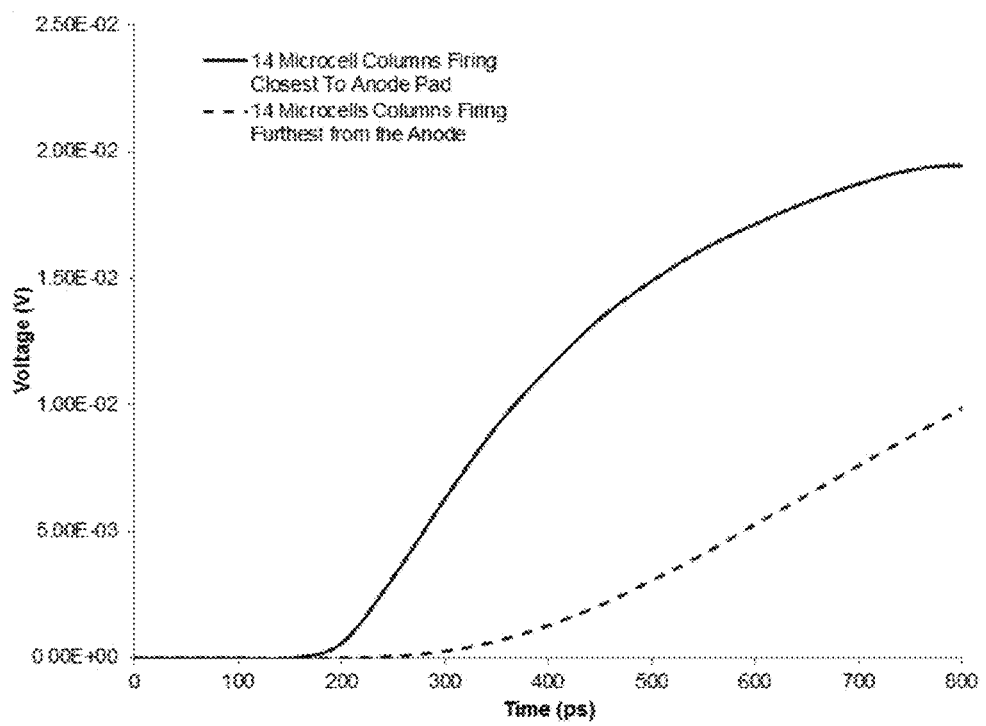
FIG. 8 is a graph which shows the signal from the microcells furthest from the major row (furthest from terminal) compared with the signal from those closest to it.

The graph of FIG. 8 shows the signal from fourteen microcells furthest from the major row (anode terminal) compared with the signal from fourteen microcells closest to major row (anode terminal). It is clear that there is significant time delay between the two signals. It is desirable to segment the major bus line in order to reduce the load on the signal. If the segments were joined together on top of the substrate 150, the area taken up by the additional bus lines would be subtracted from the optically active area, significantly reducing the photo-detection efficiency (PDE).

Figure 9:
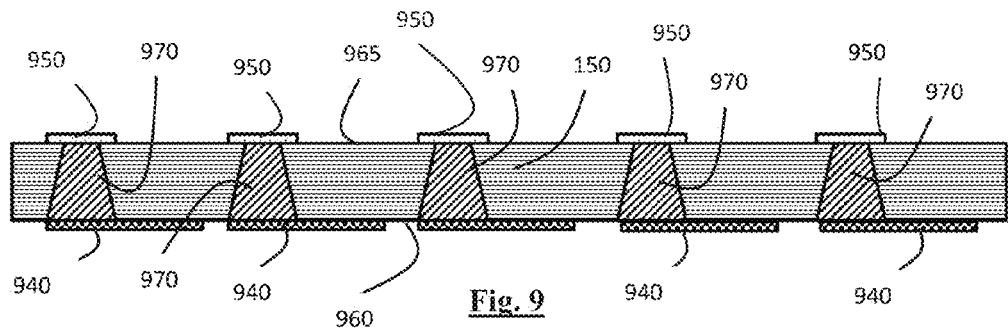
FIG. 9 shows a cross sectional view of a photomultiplier in accordance with the present teaching.
Figure 10:
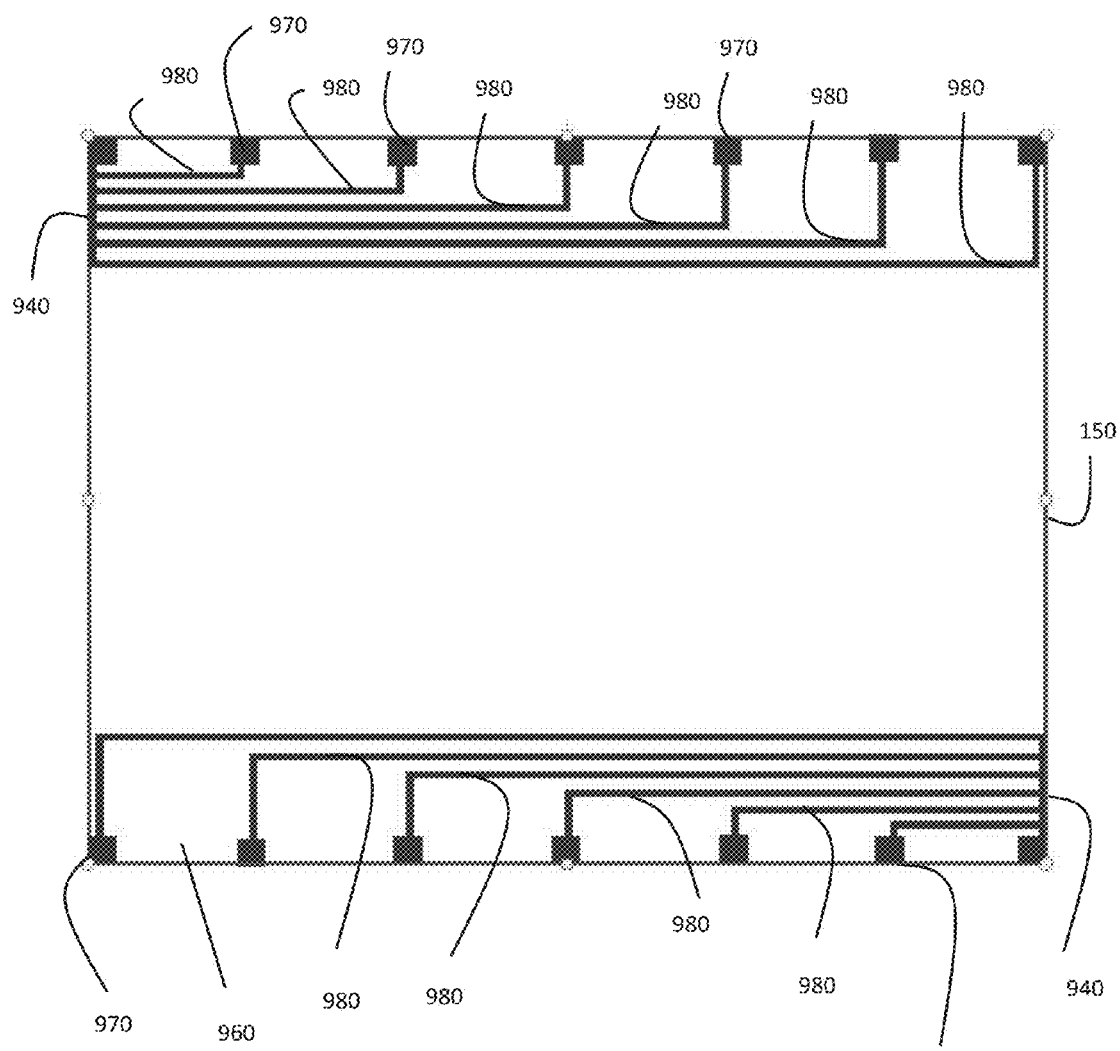
FIG. 10 is a plan view of a bottom surface of the photomultiplier of FIG. 9.

Referring now to FIGS. 9 and 10 which illustrates an exemplary layout of minor bus lines 950 and major bus lines 940 in accordance with the present teaching. The minor bus lines 950 extend vertically between the columns of microcells 125 similar as previously described with reference to FIG. 4. The major bus lines 940 are provided on a lower surface 960 of the substrate 150 and are operably coupled to the minor bus lines 950 via true silicon vias (TSVs) 970. The minor bus lines 950 interconnect the microcells 125 which are formed on an upper surface 965 of the substrate 150. The TSVs 970 are vertical connections which pass completely through the substrate 150. The number of major bus lines 940 which may be used is significantly increased compared to the arrangement of FIG. 4 because the area for accommodating the major bus lines 940 is not limited to the periphery of the upper major surface of the substrate 150. The full area of the bottom surface 960 of the substrate 150 is available to accommodate the major bus lines 940. The major bus line 940 is segmented into multiple segments 980 as illustrated in FIG. 10. In the exemplary embodiment, six segments 980 extend horizontally on the bottom surface 960 of the substrate 150. It is will be appreciated by those skilled in the art that the major bus line 940 may be segmented into any desirable number of segments 980. Routing the major bus lines 940 under the silicon substrate 150 minimises the impact on the optically active area of the SiPM. It will be clear to those skilled in the art that CRT is strongly dependant on the range of delay seen across the array of microcells in the SiPM. Reducing the range of delay by segmenting the major bus lines 940 will reduce CRT.

Figure 11:
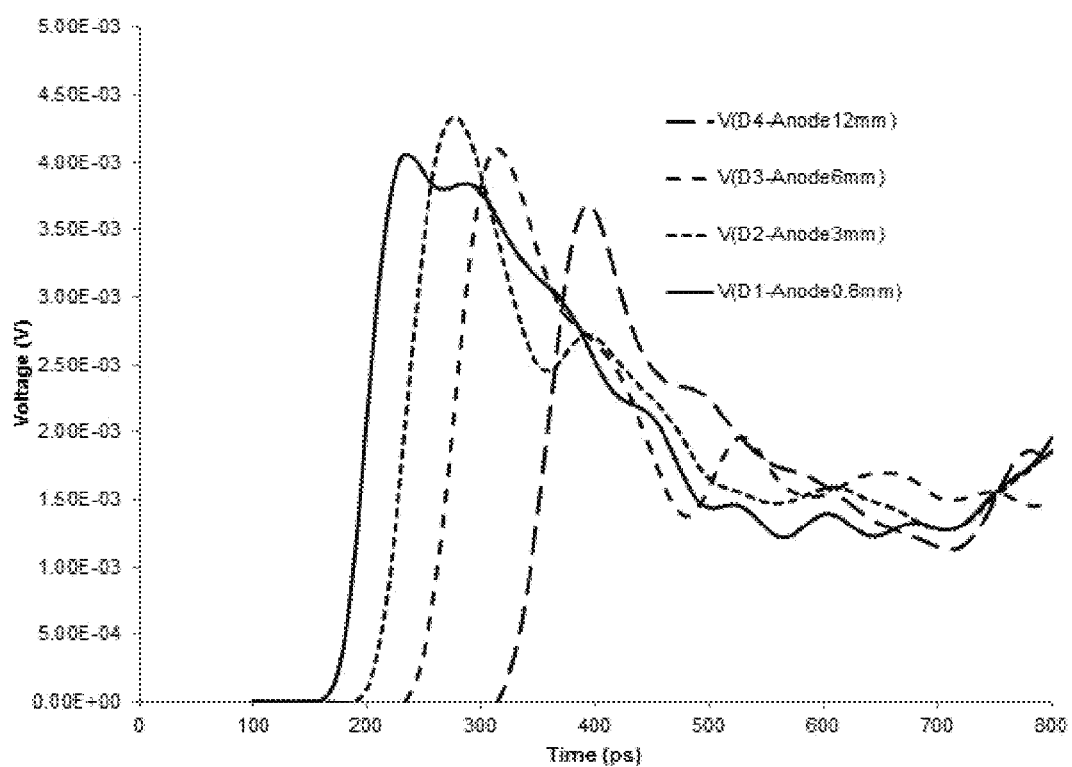
FIG. 11 is a simulated graph of the signals on a segmented (major) bus line on the bottom surface of the photomultiplier of FIG. 9.

Referring now to the graph of FIG. 11 which is a simulated graph of the SiPM of FIG. 10 showing the signal delay, rise time and overall shape of the signal of four different segments connected to different major bus lengths (980). The signal delay between the fastest and slowest signal is approximately 150 ps. Thus making the major bus lengths equal under the silicon will reduce the delay range further, thereby reducing CRT. Such a scheme is illustrated in FIG. 13.

Figure 12:
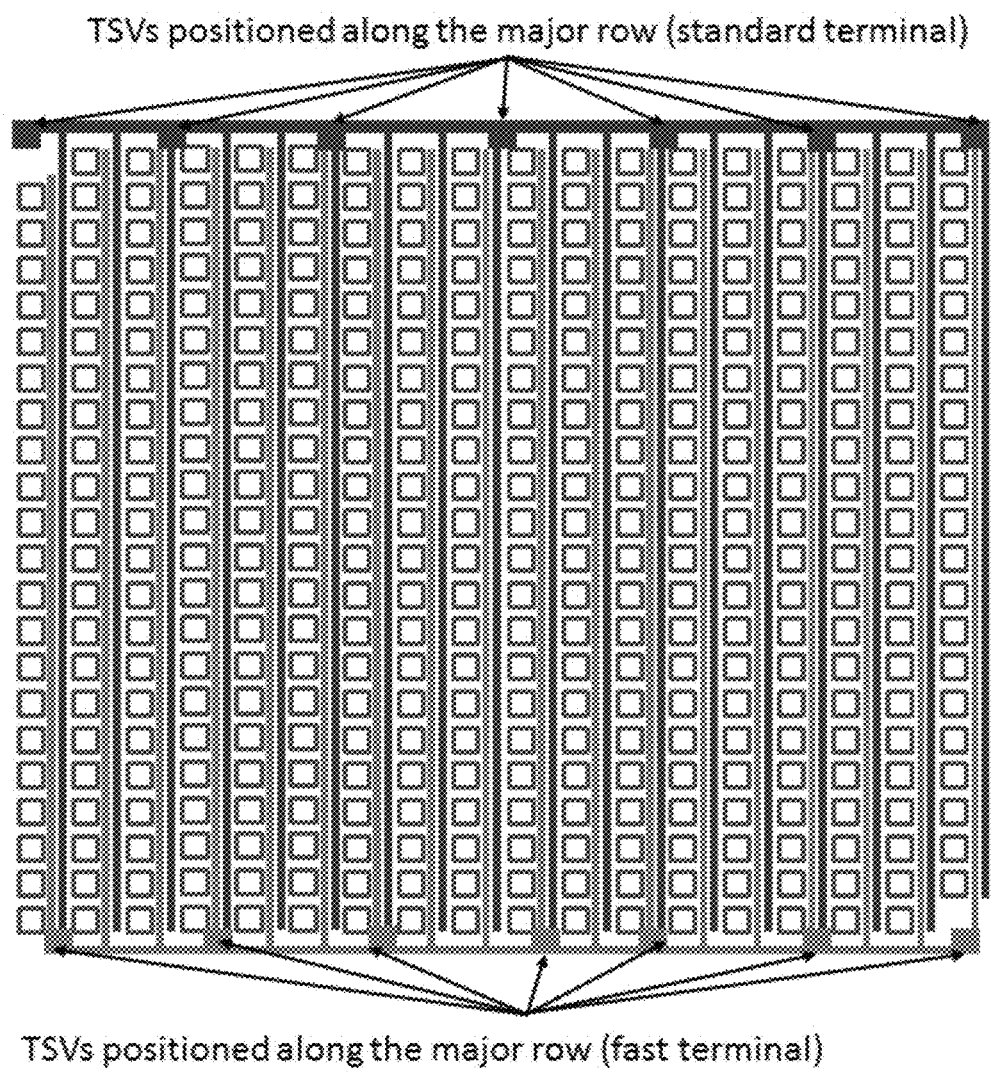
FIG. 12 is a diagrammatic illustration of primary (minor) and secondary (major) bus lines of the photomultiplier in accordance with the present teaching.

Referring now to FIG. 12 which shows TSVs positioned along the major row associated with the standard terminal 370 and TSVs positioned along the major row associated with the fast terminal 305. Using TSVs allows the arrays of microcells 125 on top surface 965 of the substrate 150 to be segmented so that the major rows are shorted. The major and minor rows may be connected to the under side of the substrate at various positions in the area of the die and shorted via copper tracks. This will effectively reduce the load on each segment of microcells 125. The reduced load will lead to a reduced range of delays (jitter and CRT). Further reductions in jitter can be achieved by using minor rows of various lengths so that the minor row load seen by a microcell furthest from the terminal is smallest and that seen by a microcell closes to the terminal is largest.

Figure 13:
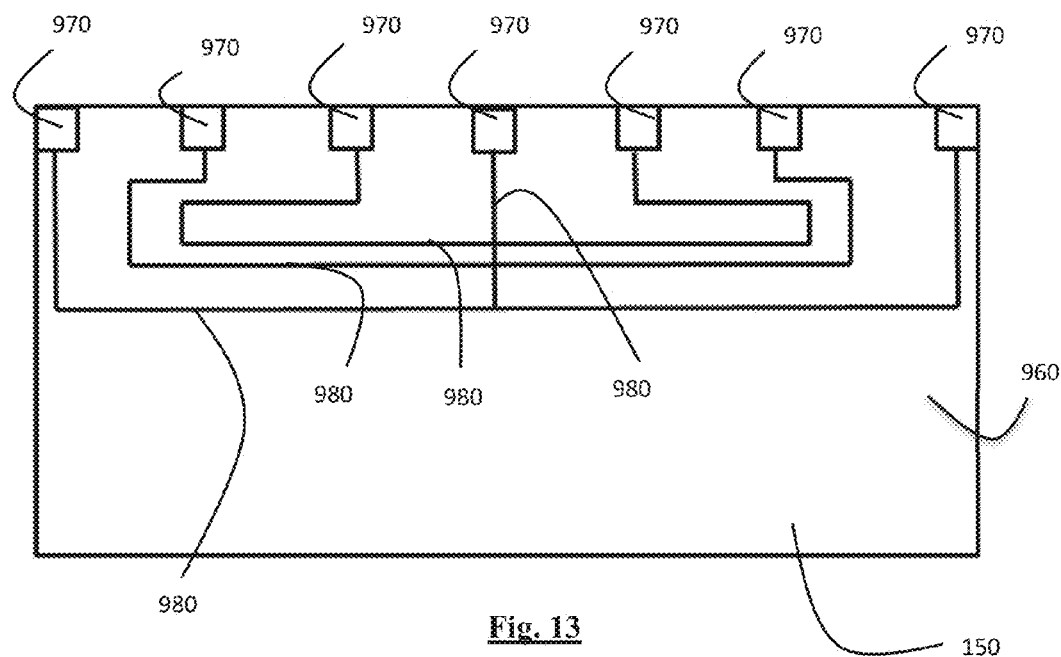
FIG. 13 is a plan view of a bottom surface of the photomultiplier in accordance with the present teaching.

Referring now to FIG. 13 there illustrated a segmented major bus line on the bottom surface 960 of the substrate 150. The major bus line is similar to the arrangement described in FIG. 10 with the exception that track length is increased in order to equalise the signal delays from the microcells 125 to the terminals. This is possible because due to the extra space under the substrate 150 to route the metal lines.

Figure 14:
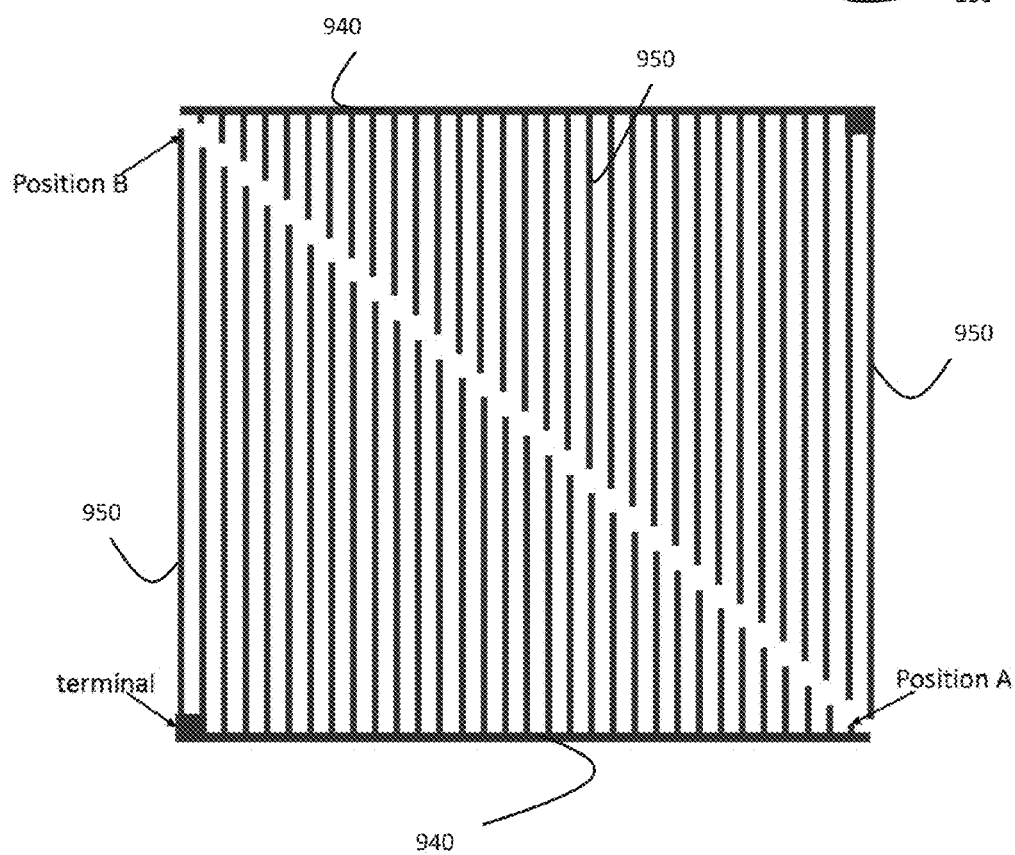
FIG. 14 is a diagrammatic illustration of primary and secondary bus lines of the photomultiplier in accordance with the present teaching.

Referring now to FIG. 14 there is illustrated an exemplary arrangement of the minor bus lines where the signal paths from the microcells to the terminals are equalised. For example, the signal path from position A to the terminal is approximately equal to signal path from position B. Such a scheme can be incorporated with the arrangement illustrated in FIGS. 9, 10, 12, 13 in order to further reduce the delay range.

Figure 15:
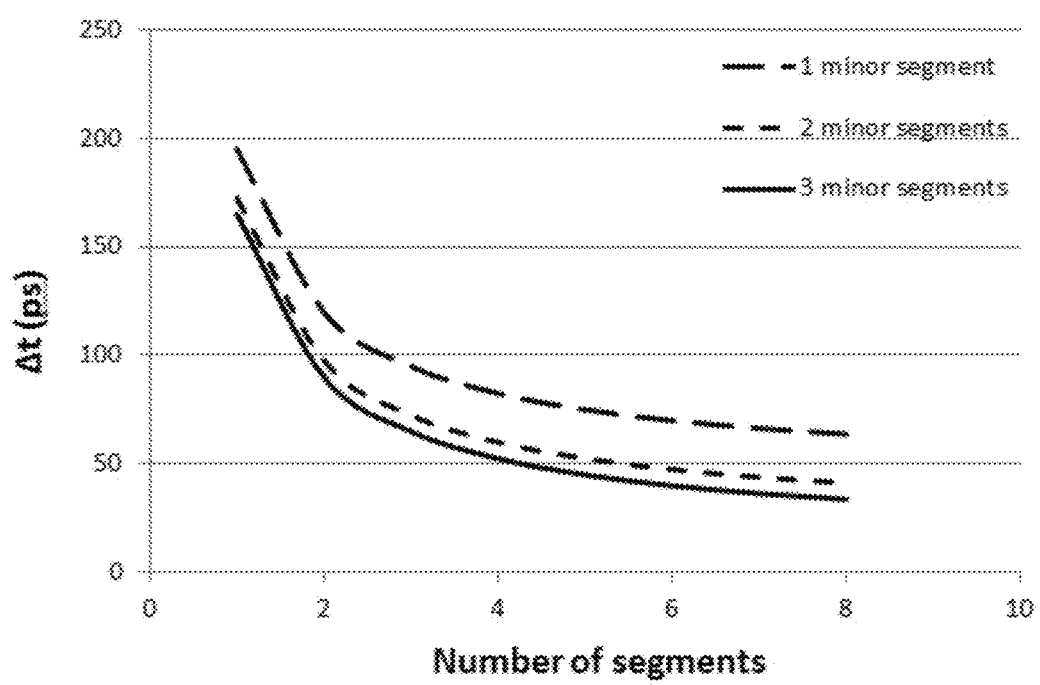
FIG. 15 is a graph illustrating improvement in delay time as result of increasing the number of segments.
Figure 16:
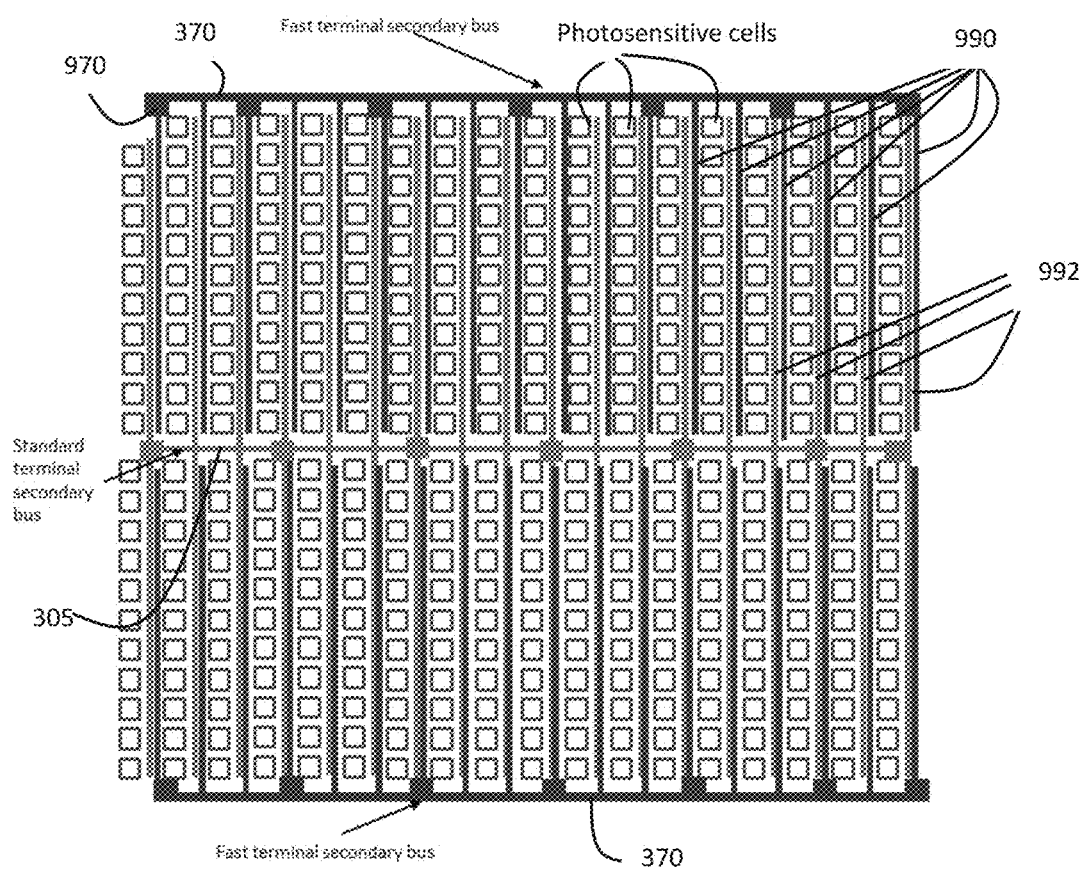
FIG. 16 is a diagrammatic illustration of an exemplary photomultiplier.
Figure 17:
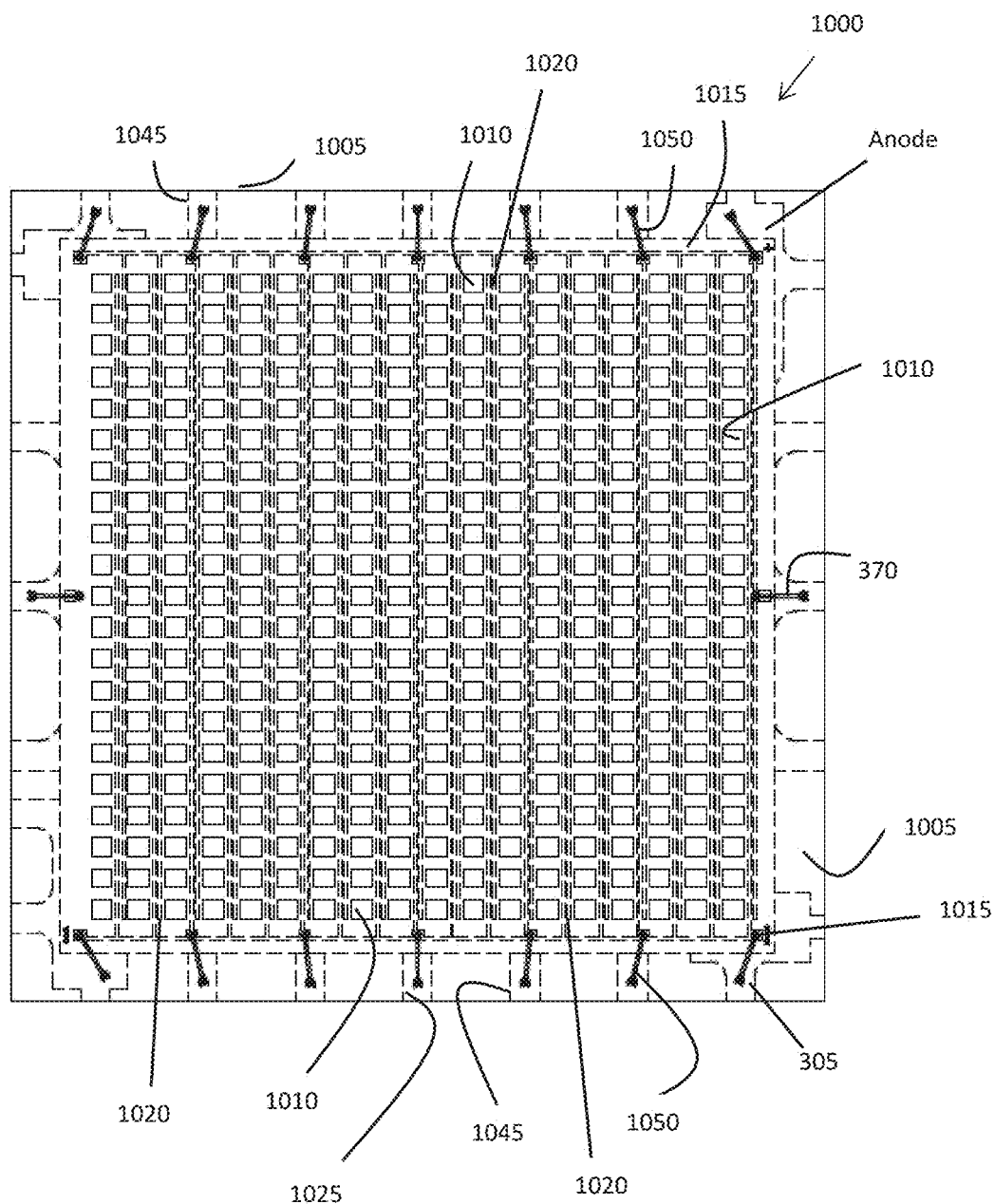
FIG. 17 is a diagrammatic illustration of an exemplary photomultiplier.

The graph of FIG. 15 shows that the rate of improvement in delay time $\Delta t$ with increasing the number of segments. In particular, the delay is significantly reduced when the secondary bus line includes five or more segments. Furthermore, by splitting the primary bus into a first set of bus lines 990 and a second set of bus lines 992 as illustrated in FIG. 16 has a significant impact on signal delay time $\Delta t$. However further dividing primary bus line has a less significant impact on $\Delta t$ performance. It has been found through experimentation that the optimum number of TSVs for a 6 mm SiPM is six on the secondary bus line with the primary bus lines divided into two. It will be appreciated by those skilled in the art that signal delays are reduced by increasing the number TSVs. The area taken up by the additional TSVs is subtracted from the optically active area, thus reducing the photo-detection efficiency (PDE). Through experimentation it has been found that there is a 0.05% reduction of PDE for each additional TSV which are included. The presenting teaching optimises $\Delta t$ while minimising the trade off by the reduction in PDE.

Figure 18:
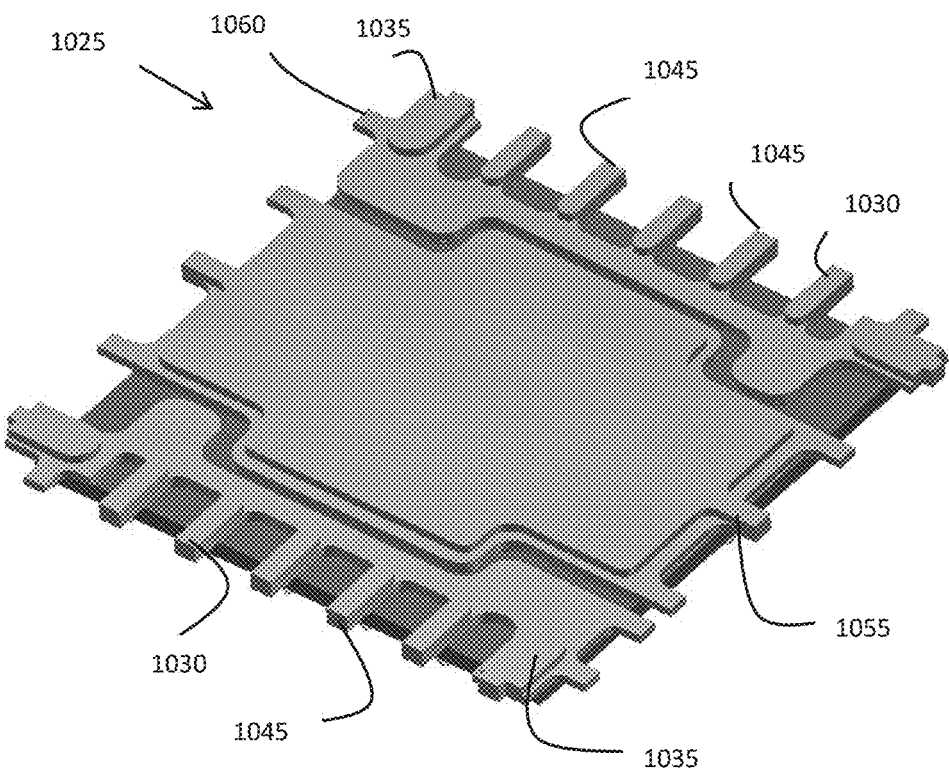
FIG. 18 is an diagrammatic illustration of a lead frame.
Figure 19:
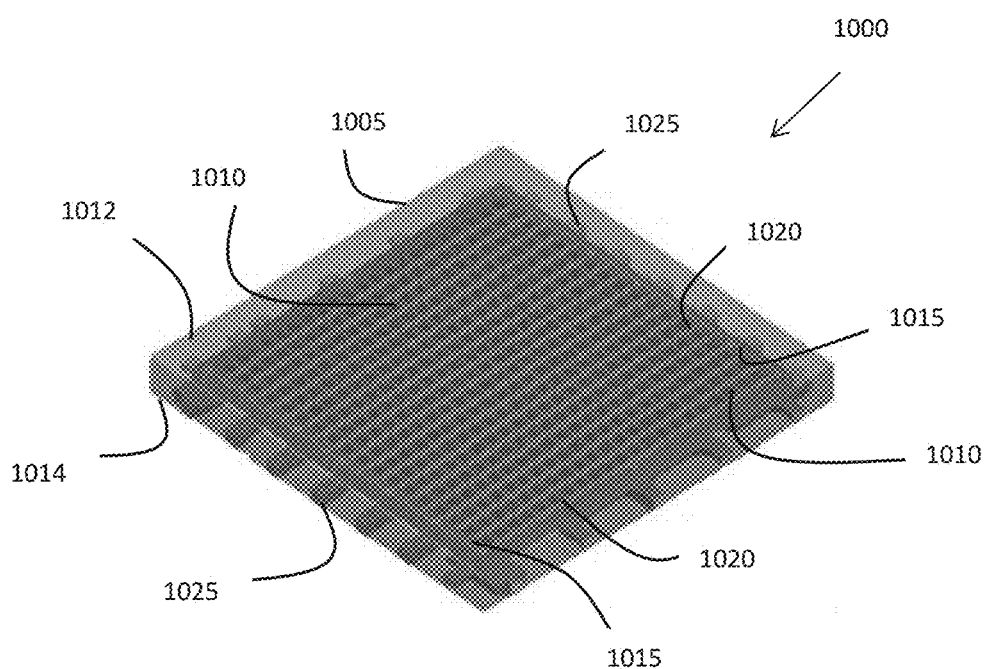
FIG. 19 is a top plan perspective view of an exemplary photomultiplier of FIG. 17.
Figure 20:
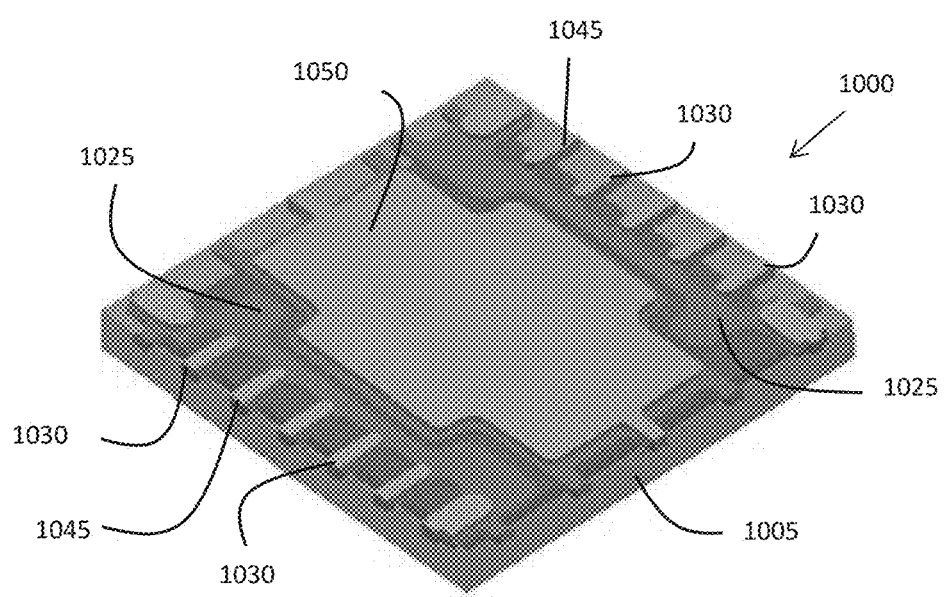
FIG. 20 is bottom plan perspective view of the photomultiplier of FIG. 17.

Referring now to FIGS. 17 to 20, there is provided another semiconductor photomultiplier 1000. The semiconductor photomultiplier 1000 is similar to the photomultipiers which have been previously described with the main difference being that TSVs are not used. The semiconductor photomultiplier 1000 comprises a substrate 1005; an array of photosensitive cells 1010 formed on the substrate 1005. The schematic circuit diagram of the photosensitive cell 1010 substantially corresponds to the schematic of FIG. 3 and like elements are referenced by similar numerals for convenience. The SPM 1000 has a third electrode 305 which is capacitively coupled to each photodiode cathode 310 in order to provide a fast readout of the avalanche signals from the photodiodes 315. When the photodiode 315 emits a current pulse, part of the resulting change in voltage at the cathode 310 will be coupled via mutual capacitance 320 into the third (fast) electrode 305. Using the third electrode 305 for readout avoids the compromised transient performance resulting from the relatively large RC time constant associated with the biasing circuit. Each photosensitive cell 1010 is associated with an output node for facilitating reading the output signal from each cell 1010. The photosensitive cells 1010 are arranged in a grid configuration having rows and columns. A plurality of primary buses 1020 are provided for interconnecting the output nodes of the photosensitive cells 1010 of a corresponding column. An electrical conductor 1025, best illustrated in FIG. 18, is provided having a plurality of connection sites 1030 for facilitating interconnecting the respective connection sites 1030 to the corresponding connection locations on the secondary bus 1015 for providing conduction paths which have lower impedance than the secondary bus line 1015. This will effectively reduce the load on each segment of the photosensitive cells. The reduced load will lead to a reduced range of delays (jitter and CRT). The grid formation is provided on a top major surface of the substrate 1005 as best illustrated in FIG. 19.

In the exemplary arrangement the array of photosensitive cells 1010 are operably coupled between an anode and a cathode. A set of primary bus lines 1020 are provided which are each associated with a corresponding set of photosensitive cells 1010. For example, each primary bus line 1020 is associated with the photosensitive cells of a particular column. A secondary bus line 1015 is coupled to the set of primary bus lines 1020. The electrical conductor 1025 includes a plurality of connection sites 1030 which are coupled to respective connection locations on the secondary bus line 1015 for providing conduction paths which have lower impedance than the secondary bus line.

In the exemplary embodiment the array of photosensitive cells 1010 are formed on a first major surface 1012 of the substrate 1005. The secondary bus line 1015 is also provided on the first major surface of the substrate 1005 and is operably coupled to the primary bus lines 1020. Wire bonds extend between the connection sites on the electrical conductor 1025 and the connection locations on the secondary bus line 1015 such that each connection site is associated with a corresponding connection location. Each connection location on the secondary bus has an associated landing pad 1026 for receiving a wire bond. In one exemplary arrangement, the respective connection sites are uniformly spaced apart. Similarly, the respective connection locations may also be uniformly spaced apart.

The electrical conductor 1025 may be provided as an output lead 1035 on a leadframe, for example. In a preferred arrangement the leadframe is located on a bottom major surface of the substrate 1005 as best illustrated in FIG. 19. The output lead 1035 includes a plurality of fingers 1045 each defining a corresponding connection site. The number of fingers 1045 corresponds to the number of connection locations on the secondary bus 1015. Interconnects in the form of wire bonds extend between the fingers and the connection locations. The leadframe may also include a cathode lead 1055 and an anode lead 1060. The substrate 1005 and portions of the leads are encapsulated in an encapsulating material which defines a housing. The distal portions of the leads extend through the housing for facilitating electrical coupling the circuit of the SPM to other circuit elements. It is not intended to limit the present teaching to a leadframe as other alternative mechanisms such as metal tracking on a PCB or similar carrier substrate may be used. Similar carrier substrates may include, for example but not limited to, ceramic chip carriers, pre-molded chip carriers, direct bonding to another wafer either via TSV or on the top surface for back illuminated operation.

The array of photosensitive cells are arranged in a grid configuration with at least some of the primary bus lines extending between the columns of the grid configuration. The primary bus lines are typically parallel to one another but other configurations are possible. The photosensitive cell 1010 may comprises an avalanche photodiode or a single photon avalanche diode and an associated quench element. The quench element may be a passive component resistor. Alternatively, the quench element may include an active circuit of component transistors.

The connection sites of the electrical conductor are coupled to connection locations on the secondary bus without using through-silicon vias in order to maximise the area on the substrate available for accommodating photosensitive active areas. If TSV were used each TSV may result in a loss of approximately 0.05% active area which directly reduces PDE. The electrical conductor arrangement with a plurality of connection sites coupled to respective connection locations on the secondary bus line using wire bonds minimises PDE loss whilst significantly improving signal delay performance.

Figure 21:
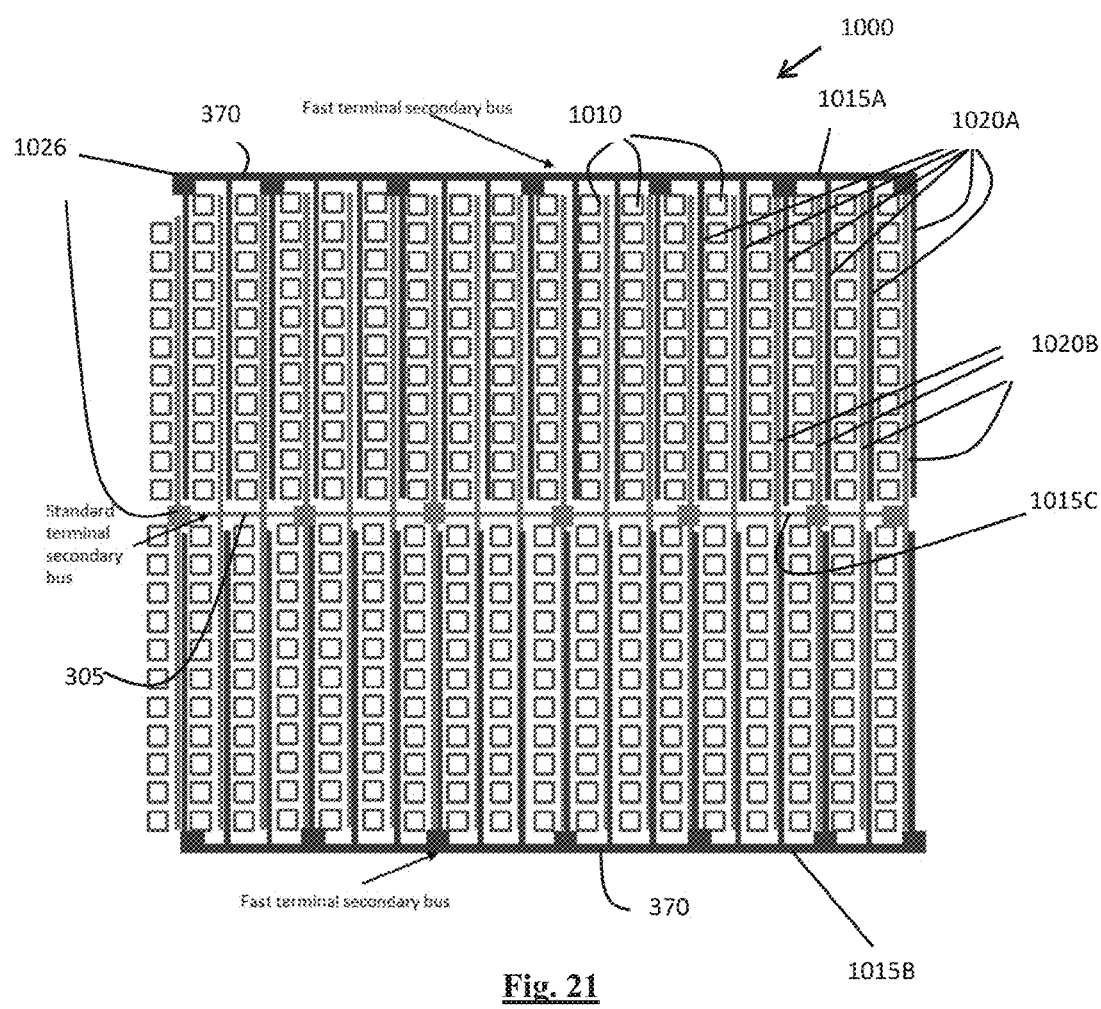
FIG. 21 is a diagrammatic illustration of an exemplary semiconductor photomultiplier showing the layout of the primary and secondary bus lines.

The layout of the primary bus lines 1020, the secondary bus line 1015 and the electrical conductor 1025 allows the photosensitive cells 1010 to comprises the circuit of FIG. 3, for example, as best illustrated in FIG. 21. In this way, the photomultiplier 1000 may include an array of photosensitive cells 1010 that are operably coupled between an anode and a cathode. A first set of primary bus lines 1020A and a second set of primary bus lines 1020B are each associated with a corresponding set of photosensitive cells 1010. A first secondary bus line 1015A is coupled to the first set of primary bus lines 1020A. A second secondary bus line 1015B is coupled to the second set of primary bus lines 1020B. A first electrical conductor is provided having a plurality of connection sites coupled to respective connection locations on the first secondary bus line 1020A for providing conduction paths which have lower impedance than the first secondary bus line 1020A. A second electrical conductor is provided having a plurality of connection sites coupled to respective connection locations on the second secondary bus line 1020B for providing conduction paths which have lower impedance than the second secondary bus line 1020B. The first set of primary bus lines 1015A may be capacitively coupled to the photosensitive cells 1010. The second set of primary bus lines 1015B may be capacitively coupled to the photosensitive cells. A readout circuit may be provided for communicating with the first and second electrical conductors.

Figure 22:
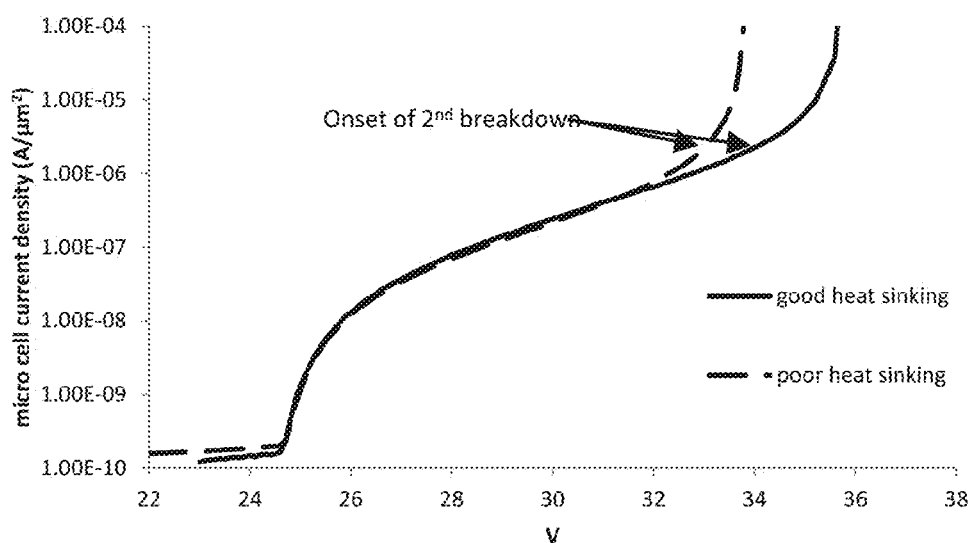
FIG. 22 is a graph showing improved performance as a result of incorporating a heat sink.

A heat sink 1050 optionally may be provided to further enhance the performance of the semiconductor photomultiplier 1000. The photomultiplier 1000 becomes less effective after a second breakdown voltage point is reached as illustrated in FIG. 22. It will be appreciated by those skilled in the art that the second breakdown onset voltage is temperature dependant. Advantageously, the second breakdown onset voltage may be increased by incorporating a heat sink which cools the photomultiplier 1000 by dissipating heat into the surrounding area. As a consequence, the operating voltage range of the SiPM may be increased.

Figure 23:
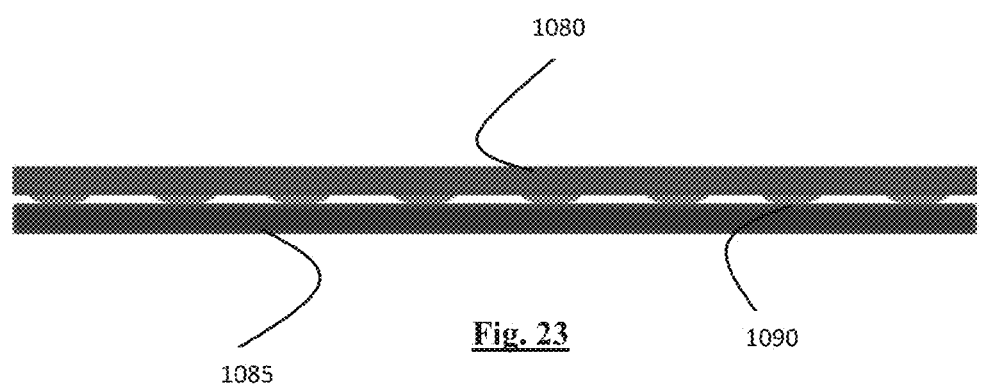
FIG. 23 is a side perspective view of an exemplary photomultiplier.

Referring now to FIG. 23 which describes an optional arrangement whereby the substrate is provided on a first wafer 1080. The first wafer 1080 is operably coupled to a second wafer 1085 in a stacked arrangement with both wafers substantially parallel to one another. The second wafer 1085 may include circuit components such as a readout circuit by way of example. In the stacked arrangement, the first and second wafers are operably coupled together with a solder bump interconnection arrangement 1090.

It will be appreciated by those of ordinary skill in the art that the silicon photomultiplier of the present teaching may be fabricated on the substrate 1005 using conventional semiconductor processing techniques and may include for example, but not limited to, deposition, implantation, diffusion, patterning, doping, and etching. In this way, the method of fabrication may include the following steps which are provided by way of example; providing an array of photosensitive cells on a substrate that are operably coupled between an anode and a cathode; providing a set of primary bus lines each being associated with a corresponding set of photosensitive cells; providing a secondary bus line coupled to the set of primary bus lines; and providing an electrical conductor having a plurality of connection sites coupled to respective connection locations on the secondary bus line for providing conduction paths which have lower impedance than the secondary bus line.

In an alternative embodiment, the fabrication steps may include by way of example; providing an array of photosensitive cells on a substrate that are operably coupled between an anode and a cathode; providing a first set of primary bus lines and a second set of primary bus lines each being associated with a corresponding set of photosensitive cells; providing a first secondary bus line coupled to the first set of primary bus lines; providing a second secondary bus line coupled to the second set of primary bus lines; providing a first electrical conductor having a plurality of connection sites coupled to respective connection locations on the first secondary bus line for providing conduction paths which have lower impedance than the first secondary bus line; and providing a second electrical conductor having a plurality of connection sites coupled to respective connection locations on the second secondary bus line for providing conduction paths which have lower impedance than the second secondary bus line.

It will be appreciated by the person of skill in the art that various modifications may be made to the above described embodiments without departing from the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to.

Similarly the words comprises/comprising when used in the specification are used to specify the presence of stated features, integers, steps or components but do not preclude the presence or addition of one or more additional features, integers, steps, components or groups thereof.

We claim:

1. A readout system comprising:
an array of photosensitive cells operably coupled between an anode and a cathode;
a set of primary bus lines each being associated with a corresponding set of photosensitive cells of the array of photosensitive cells;
a secondary bus line coupled to bus lines of the set of primary bus lines, the secondary bus line having a plurality of connection locations thereon;
an electrical conductor having a plurality of connection sites thereon, each connection site of the plurality of connection sites coupled to a respective connection location of the plurality of connection locations on the secondary bus line;
a plurality of interconnects that extend between the plurality of connection sites and their corresponding respective connection locations, wherein each interconnect of the plurality of interconnects defines a corresponding conduction path between the secondary bus line and the electrical conductor; and
a readout circuit operable for communicating with the electrical conductor.

2. The readout system of claim 1, wherein the array of photosensitive cells are formed on a first major surface of a substrate.

3. The readout system of claim 2, wherein the secondary bus line is provided on the first major surface of the substrate.

4. The readout system of claim 3, wherein the electrical conductor is provided on a second major surface of the substrate, with the second major surface being opposite the first major surface.

5. The readout system of claim 1, wherein each connection site is coupled to its respective connection location by wire bonding.

6. The readout system of claim 1, wherein connection sites of the plurality of connection sites are uniformly spaced apart.

7. The readout system of claim 6, wherein the respective connection locations are uniformly spaced apart.

8. The readout system of claim 1, wherein the electrical conductor is an output lead on a leadframe.

9. The readout system of claim 8, wherein the leadframe includes a cathode lead and an anode lead.

10. The readout system of claim 9, wherein the output lead includes a plurality of fingers each defining a corresponding connection site of the plurality of connection sites.

11. The readout system of claim 10, wherein each finger is associated with a corresponding one of the plurality of connection locations on the secondary bus line.

12. The readout system of claim 1, wherein each of the plurality of connection locations on the secondary bus line has an associated landing pad for receiving a wire bond.

13. The readout system of claim 1, wherein the electrical conductor comprises a metal track.

14. The readout system of claim 1, wherein the electrical conductor is on a carrier substrate.

15. The readout system of claim 14, wherein the carrier substrate comprises one of a PCB, a ceramic chip carrier, and a pre-molded chip carrier.

16. The readout system of claim 1, wherein the array of photosensitive cells is arranged in a grid configuration having rows and columns.

17. The readout system of claim 16, wherein at least some primary bus lines of the set of primary bus lines extend between the columns of the grid configuration.

18. The readout system of claim 17, wherein the at least some primary bus lines are parallel to one another.

19. The readout system of claim 1, wherein each photosensitive cell of the array of photosensitive cell comprises a single photon avalanche diode (SPAD).

20. The readout system of claim 19, wherein a quench element is associated with each SPAD.

21. The readout system of claim 20, wherein the quench element is a passive component resistor.

22. The readout system of claim 1, wherein each photosensitive cell of the array of photosensitive cell comprises a photodiode.

23. The readout system of claim 22, wherein each photosensitive cell of the array of photosensitive cell further comprises a resistor coupled in series to the photodiode.

24. The readout system of claim 23, wherein each photosensitive cell of the array of photosensitive cell comprises a capacitive element.

25. The readout system of claim 1, wherein each photosensitive cell of the array of photosensitive cell comprises an avalanche photodiode.

26. The readout system of claim 1, further comprising a heat sink that is co-operable with a substrate.

27. The readout system of claim 1, wherein a substrate is provided on a first wafer.

28. The readout system of claim 27, wherein the first wafer is operably coupled to a second wafer.

29. The readout system of claim 28, wherein the first wafer and the second wafer are in stacked arrangement.

30. The readout system of claim 28, wherein the first wafer and the second wafer are parallel to each another.

31. The readout system of claim 28, wherein circuit components are provided on the second wafer.

32. The readout system of claim 31, wherein the first wafer and the second wafer are operably coupled together with a solder bump interconnection arrangement.

33. The readout system of claim 1, wherein each connection site of the plurality of connection sites is coupled to its respective connection location on the secondary bus line without using through-silicon vias, thereby maximising an area on a substrate available for accommodating photosensitive active areas.

34. A readout system comprising:

an array of photosensitive cells formed on a substrate that are operably coupled between an anode and a cathode;

a first set of primary bus lines and a second set of primary bus lines, wherein each primary bus line of the first set of primary bus lines or the second set of primary bus lines is associated with a corresponding set of photosensitive cells of the array of photosensitive cells;

a first secondary bus line coupled to the first set of primary bus lines, the first secondary bus line having a first plurality of connection locations thereon;

a second secondary bus line coupled to the second set of primary bus lines, the second secondary bus line having a second plurality of connection locations thereon;

a first electrical conductor having a first plurality of connection sites thereon, each connection site of the first plurality of connection sites coupled to a respective connection location of the first plurality of connection locations on the first secondary bus line for providing a first plurality of conduction paths between the first secondary bus line and the first electrical conductor;

a second electrical conductor having a second plurality of connection sites thereon, each connection site of the second plurality of connection sites coupled to a respective connection location of the second plurality of connection locations on the second secondary bus line for providing a second plurality of conduction paths between the second secondary bus line and the second electrical conductor; and a readout circuit operable for communicating with the first and second electrical conductors.

* * * * *